United States Patent
Bartley et al.

(10) Patent No.: US 8,466,024 B2
(45) Date of Patent: Jun. 18, 2013

(54) POWER DOMAIN CONTROLLER WITH GATED THROUGH SILICON VIA HAVING FET WITH HORIZONTAL CHANNEL

(75) Inventors: Gerald K. Bartley, Rochester, MN (US); Darryl J. Becker, Rochester, MN (US); Philip R. Germann, Oronoco, MN (US); Andrew B. Maki, Rochester, MN (US); John E. Sheets, II, Zumbrota, MN (US)

(73) Assignee: International Business Machines Corporation, Armonk, NY (US)

( * ) Notice: Subject to any disclaimer, the term of this patent is extended or adjusted under 35 U.S.C. 154(b) by 372 days.

(21) Appl. No.: 12/966,303

(22) Filed: Dec. 13, 2010

(65) Prior Publication Data

US 2012/0146711 A1    Jun. 14, 2012

(51) Int. Cl.
*H01L 21/336* (2006.01)

(52) U.S. Cl.
USPC .................... 438/270; 257/E21.41

(58) Field of Classification Search
USPC ............. 438/524, 589, 270, 672, 675, 282, 438/272, 268, 246, 192, 175, 173, 108, 107, 438/667; 257/E29.213, E23.011, E29.266, 257/E29.262, E21.585, E21.419, E21.41
See application file for complete search history.

(56) References Cited

U.S. PATENT DOCUMENTS

| | | | |
|---|---|---|---|
| 7,633,165 B2 | 12/2009 | Hsu et al. | |
| 7,843,064 B2 | 11/2010 | Kuo et al. | |
| 2007/0052056 A1* | 3/2007 | Doi et al. | 257/462 |
| 2009/0243676 A1 | 10/2009 | Feng | |
| 2010/0259296 A1 | 10/2010 | Or-Bach | |
| 2011/0266683 A1* | 11/2011 | Feng | 257/773 |
| 2012/0211829 A1 | 8/2012 | Bartley et al. | |

OTHER PUBLICATIONS

Takashi Yoshinaga and Minoru Nomura, "Trends in R&D in TSV Technology for 3D LSI Packaging." Science & Technology Trends. Quarterly Review No. 37, pp. 26-39, Oct. 2010.
Soon Wee Ho, Seung Wook Yoon, Qiaoer Zhou, Krishnamachar Pasad, Vaidyanathan Kripesh, and John H. Lau. "High RF Performance TSV Silicon Carrier for High Frequency Application." Electronic Components and Technology Conference, 2008. ECTC 2008. 58th, pp. 1946-1952, May 27-30, 2008.

* cited by examiner

*Primary Examiner* — Matthew Landau
*Assistant Examiner* — Latanya N Crawford
(74) *Attorney, Agent, or Firm* — Robert R. Williams

(57) ABSTRACT

A semiconductor chip has a gated through silicon via (TSVG). The TSVG may be switched so that the TSVG can be made conducting or non-conducting. The semiconductor chip may be used between a lower level semiconductor chip and a higher semiconductor chip to control whether a voltage supply on the lower level semiconductor chip is connected to or disconnected from a voltage domain in the upper level semiconductor chip. The TSVG comprises an FET controlled by the lower level chip as a switch.

2 Claims, 6 Drawing Sheets

Top View

Side View
Through Cross
Section AA

Top View

Top View

Top View

Top View

Boron Implant profiles for the <110> direction with 15keV and 80keV energies
"Effect of silicon bonds on channeling implant simulations" J. Hernandez, et al

US 8,466,024 B2

POWER DOMAIN CONTROLLER WITH GATED THROUGH SILICON VIA HAVING FET WITH HORIZONTAL CHANNEL

FIELD OF THE INVENTION

This invention relates generally to semiconductor chips, and more specifically to creation of Field Effect Transistors (FETs) in a through silicon via (TSV).

SUMMARY OF EMBODIMENTS OF THE INVENTION

Volumetric density of semiconductor packaging is being improved by packaging semiconductor chips in "chip stacks", interconnecting a number of semiconductor chips using solder ball connectors or other techniques for providing electrical connections between chips in the chip stack. Often, for power considerations, power domains on a semiconductor chip (the entire semiconductor chip perhaps being a single power domain) may be powered down using a switch control in a semiconductor chip further down in the chip stack.

In embodiments of the invention, a semiconductor chip comprises a gated through silicon via (TSVG). The TSVG comprises an FET (the FET may comprise a plurality of FET devices connected in parallel). The FET has an FET channel, that in the width direction is perpendicular to a top surface of the semiconductor chip so that, when conducting current, the current will flow "horizontally", that is, parallel to the top surface of the semiconductor chip.

A semiconductor chip having the TSVG is placed between a lower semiconductor chip and a higher semiconductor chip and is electrically coupled to the bottom chip using a connector from a bottom surface of the semiconductor chip to the lower semiconductor chip, and to the top chip using a connector from a top surface of the semiconductor chip to the higher semiconductor chip. The lower semiconductor chip controls a gate electrode in the TSVG to switch the FET "on" to connect a voltage source on the bottom chip to a voltage domain in the top chip, or to switch the FET in the TSVG "off" to disconnect the voltage source on the bottom chip from the voltage domain in the top chip.

DETAILED DESCRIPTION OF THE EMBODIMENTS

In the following detailed description of embodiments of the invention, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

Embodiments of the present invention provide for gating, on a first semiconductor chip, a voltage supply distributed from a second semiconductor chip to a third semiconductor chip through the first semiconductor chip. A gated through silicon via (TSVG) having a field effect transistor (FET) on the first semiconductor chip is controlled to pass the voltage supply from the second semiconductor chip to the third semiconductor chip when the FET is "on", and to not pass the voltage supply from the second semiconductor chip to the third semiconductor chip when the FET is "off". Although such gating is not limited to voltage supplies, voltage supplies are used herein for exemplary purposes. The FET may be a plurality of FETs connected in parallel.

Figure 1A:
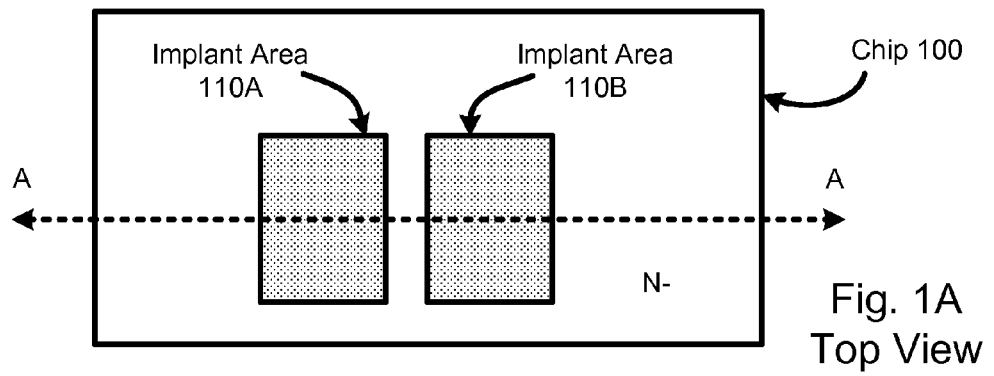
FIG. 1A shows a top view of a semiconductor chip having a plurality (two shown) implant areas for source/drain regions of a field effect transistor (FET). A cross section AA is shown.

Having reference now to FIG. 1A, a top view of a chip 100 is shown. Implant areas 110A and 110B are shown. Implant areas 110A and 110B are source/drain regions for an FET. Chip 100 is shown as being doped N– and implant areas 110A and 110B (generically simply referred to as implant areas 110) are doped P+ for creation of a PFET. Note that although chip 100 is shown as being N– with P+ implant areas for making a PFET, in another embodiment, chip 100 may be P–, with N+ implant areas for making an NFET.

Figure 1B:
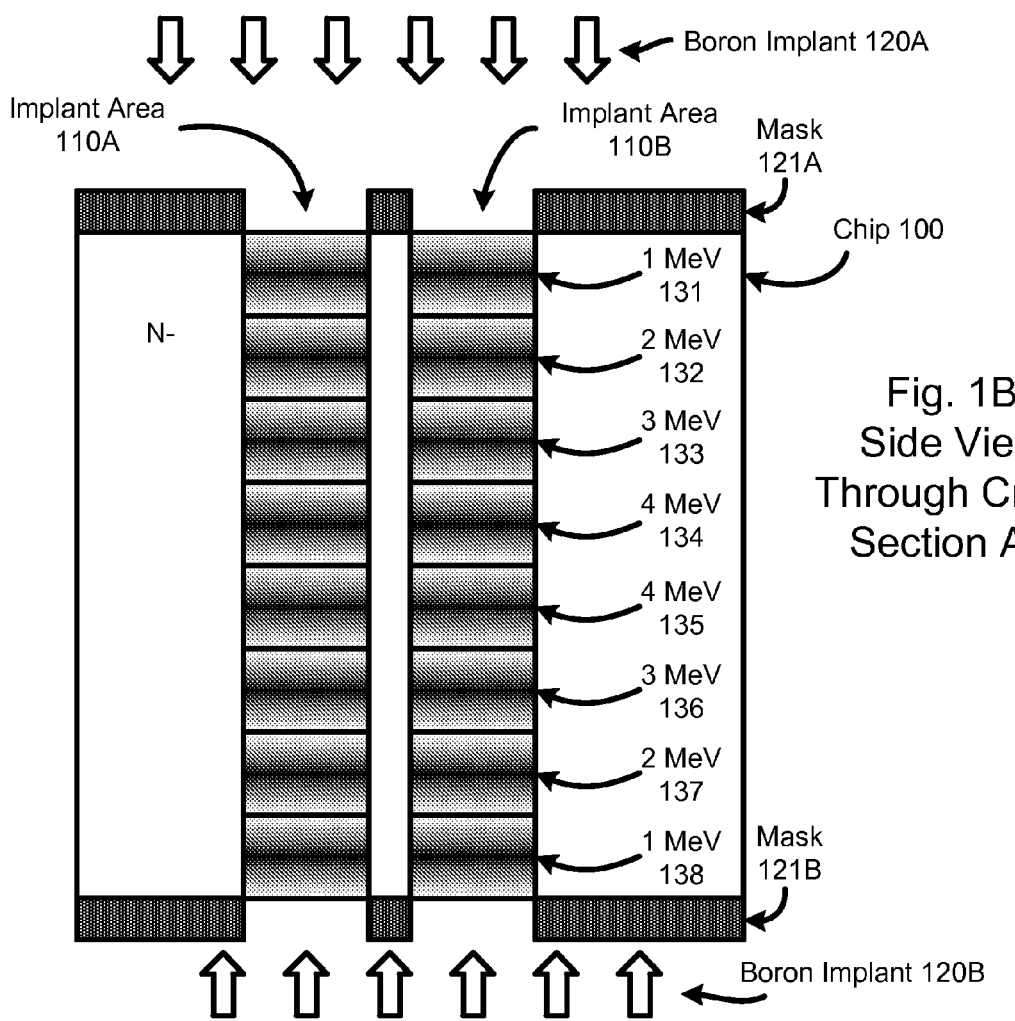
FIG. 1B shows a side view through AA of the semiconductor chip. Boron implants from top and bottom of the semiconductor chip are shown as well as implants in the implant areas.
Figure 5:
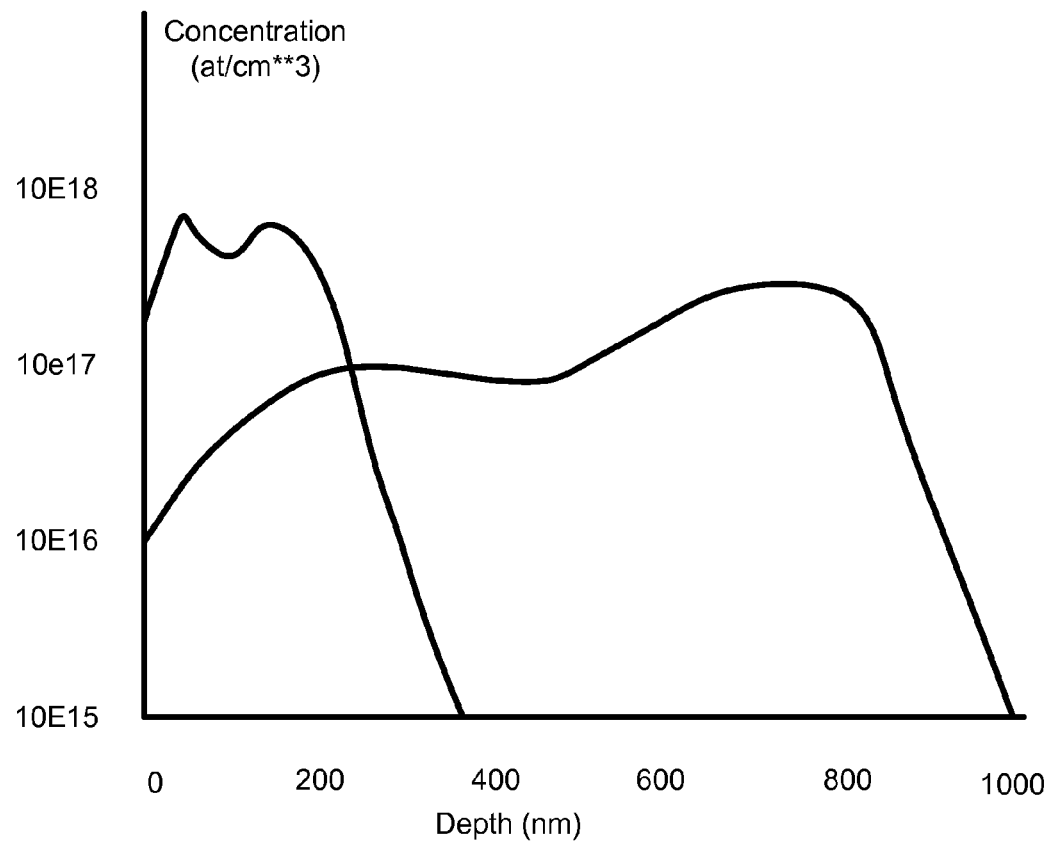
FIG. 5 shows a prior art simulation of boron concentration density versus depth at two implant energy levels.

FIG. 1B shows a cross section of chip 100 at cross section AA. Boron implants 120A, 120B, through masks (photoresist) 121A, 121B are used to make implant areas 110A, 110B P+. Typically, chip 100 is approximately 40 um (micrometers) thick. A 4 meV (million electron volts) boron implant will have a peak dose at about 20 um. For a 40 um thick chip 100, therefore, a 4 MeV 134 is implanted through mask 121A and a 4 MeV 135 is implanted through mask 121B). Additional, progressively less energetic, 3 MeV implants 133 and 136; 2 MeV implants 132 and 137; and 1 MeV implants 131 and 138 are implanted through masks 121A and 121B to provide a relatively even implant concentration of boron through chip 100. It will be understood that the order of the implants is not important, for example, the less energetic implants may be performed prior to the more energetic implants. Boron implants in <110> silicon tend to have a relatively flat peak, as shown in prior art FIG. 5, for example. FIG. 5 shows simulated dopant concentration versus depth for two boron implant energies in <110> silicon. Prior art FIG. 5 is taken from FIG. 5 of "Effect of silicon bonds on channeling implant simulations" by J. Hernandez, et al., and is used only for illustrating that boron implants in <110> silicon tend to have a flat peak. Boron implants in <100> silicon tend to have a sharper peak. Actual number of doses, energy of doses, and duration of implant doses depend on the thickness of chip 100 and type of silicon used in chip 100. Overlaps in the implants must be considered when determining energies and durations of implanting such that doping concentrations of implant areas is relatively constant between the top and bottom surfaces of the semiconductor chip.

Figure 2A:
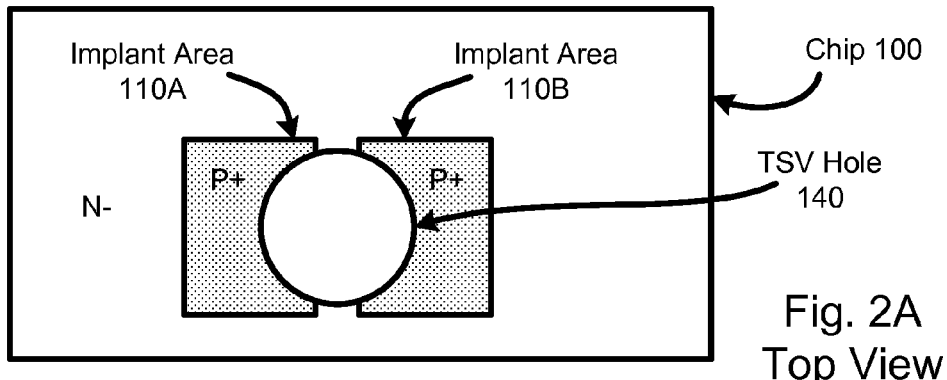
FIGS. 2A-2D show key processing steps of embodiments of the invention.
Figure 2B:
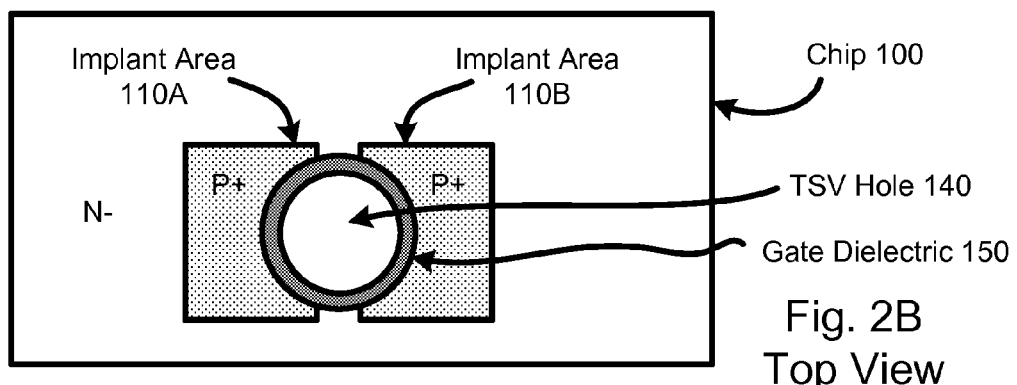
Figure 2C:
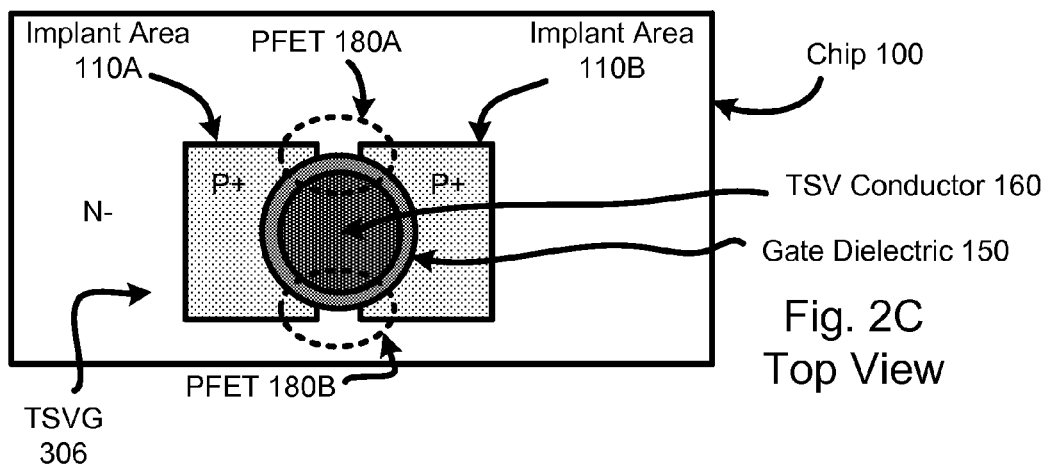

Turning now to top views of chip 100 shown in FIGS. 2A-2C, key steps in making a gated through silicon via, TSVG 306, are shown.

FIG. 2A shows the structure of FIG. 1A after creation of a TSV hole 140. TSV hole 140 extends all the way through chip 100. Note that "back end of line" (BEOL) processing will subsequently be performed to add passivation and one or more layers of interconnect. "Through chip 100" as used with reference to the TSV hole 140, implants 110A, 110B, and gate dielectrics described herein mean "through the silicon portion of chip 100" and do not include BEOL structures. TSV hole 140 passes through at least a portion of implant area 110A and implant area 110B. Implant areas 110A, 110B should be large enough relative to TSV hole 140 to accommodate alignment tolerances between TSV hole 140 and implant areas 110A, 110B. For example, TSV hole 140 should not extend above (or below) implant areas 110A, 110B, or PFET channel lengths would become larger than desired as will become apparent in the discussion below.

FIG. 2B shows the structure of FIG. 2A after deposition of a gate dielectric 150 on TSV hole 140. Gate dielectric 150 may be $SiO_2$, $HfO_2$, or other suitable dielectric material.

FIG. 2C shows the structure of FIG. 2B after filling the remaining volume of TSV hole 140 hole with a TSV conductor 160. TSV conductor 160 may be a metal such as tungsten, or may be other conducting material such as doped polysilicon. TSV conductor 160 serves as a gate electrode for PFET 180A and PFET 180B. Gate dielectric 150 serves as a gate dielectric for PFET 180A and PFET 180B. Implant area 110A serves as a first source/drain for PFET 180A and PFET 180B. Implant area 110B serves as a second source/drain for PFET 180A and PFET 180B. A body of PFET 180A and PFET 180B is the N− silicon of chip 100. Note that PFETs 180A, 180B are connected in parallel, sharing a common gate electrode (TSV conductor 160), and sharing first source drain and second source drain regions (implant area 110A, 110B). Channel length is determined by distance between implant areas 110A, 110B. Since PFETs 180A and PFET 180B are connected in parallel and are therefore logically one PFET, they may be collectively called simply PFET 180.

Figure 2D:
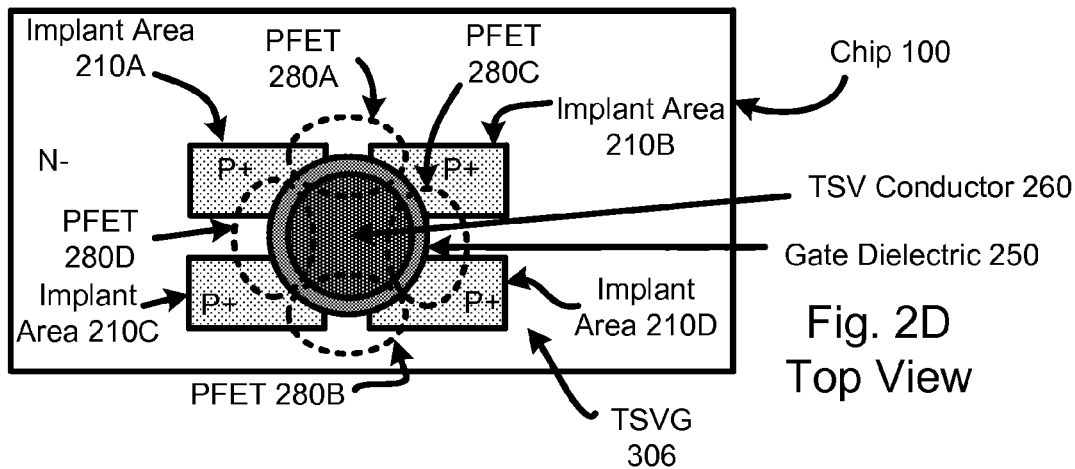
Figure 2E:
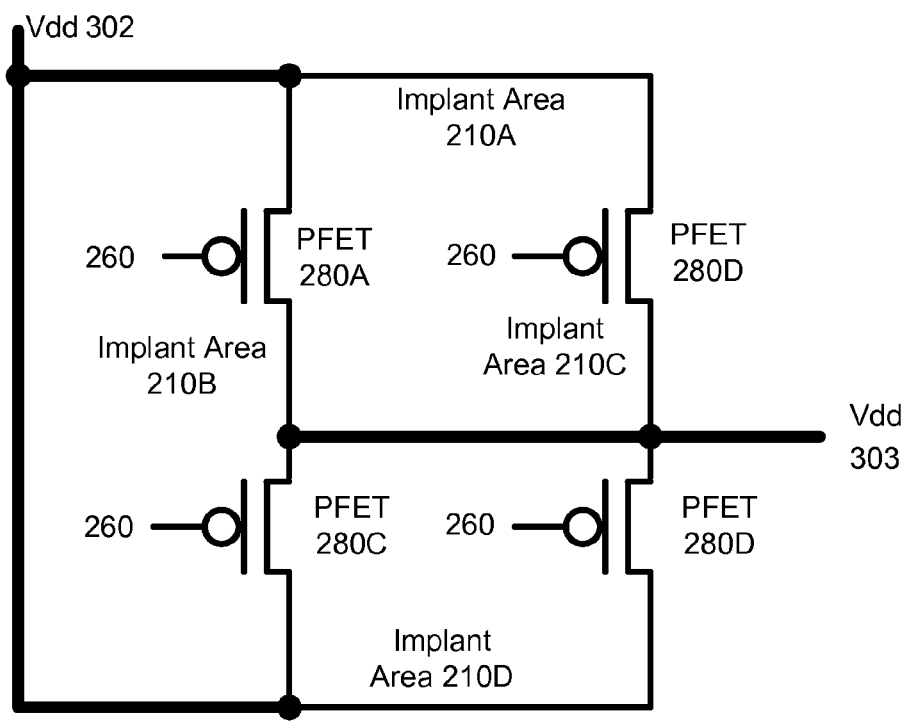
FIG. 2E shows a schematic of the structure of FIG. 2D.

FIG. 2D shows a four-PFET embodiment of the invention. Four implant areas (210A, 210B, 210C, 210D) are used instead of the two implant areas 110A, 110B shown and described above. A TSV hole (similar to TSV hole 140, FIG. 2A) cuts through portions of implant areas 210A, 210B, 210C, and 210D as shown in FIG. 2D. Gate dielectric 250 and TSV conductor 260 are formed as explained earlier with reference to gate dielectric 150 and TSV conductor 160. Four PFETs are formed, PFETs 280A, 280B, 280C, and 280D. Interconnection on chip 100 is provided to connect PFETs 280A, 280B, 280C, and 280D in parallel, as shown in FIG. 2E. FIG. 2E shows a voltage supply Vdd 302 being switchably connected to Vdd 303 by PFETs 280A-D. Bolder lines indicate wiring on chip 100 to connect Vdd 302 to implant areas 210A and 210D (source of PFETs 280A-D). A bolder line also indicates wiring on chip 100 that interconnects implant areas 210B and 210C (drains of PFETs 280A-D). When TSV conductor 260 is "low" (e.g., Gnd), PFETs 280A-D are all turned on, providing a low impedance connection between Vdd 302 and Vdd 303. If TSV conductor 260 is "high" (e.g., Vdd 302), PFETs 280A-D are "off". Parallel connected PFETs 280A-D can have a large width to length ratio. For example, if chip 100 is 40 um high, total channel width is 160 um. Length of the PFET channels is determined by spacings between implant areas 210A-D. In today's technology, spacing may be controlled to approximately 1 um, providing approximately a 160:1 width to length ratio. Note that there is a slight curvature of gate dielectric 250 (and, in the two PFET example shown earlier, gate dielectric 150) which slightly extends the channel length of the PFETs. Since PFETs 280A-D are connected in parallel, they may be collectively be called simply PFET 280. In the exemplary embodiment (FIG. 2C) where only two PFETs (180A, 180B) are used, width to length ratio would be approximately 80:1.

It will be noted that, since the PFET channels are vertical with respect to the top and bottom surfaces of chip 100, that current travels horizontally with respect to the top and bottom surfaces of chip 100.

Figure 3:
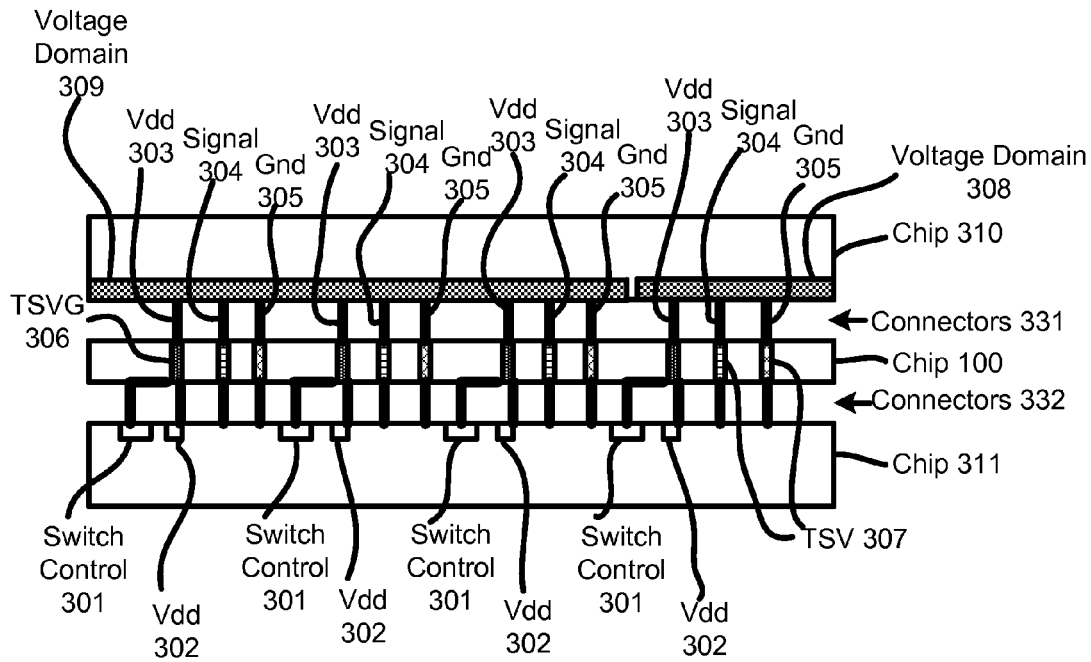
FIG. 3 shows the semiconductor chip constructed in FIGS. 2A-2D, used to gate power distributed from a second semiconductor chip to a third semiconductor chip.

Turning now to FIG. 3, chip 100 is shown interposed between a chip 310 and a chip 311 in a chip stack. A number of connectors 331, such as solder balls or other known chip stack connectors interconnects chip 100 to chip 310. A number of connectors 332, such as solder balls or other known chip stack connectors interconnects chip 100 to chip 311.

Chip 100 may comprise a number of conventional TSVs 307 to connect logic signals and ground (or other voltage supply that is not gated) through chip 100.

Chip 100 further comprises one or more gated TSVs TSVG 306, shown in dark crosshatch in FIG. 3. TSVG 306 receives a signal from a switch control 301 which is connected to a TSV conductor 160 (or 260). TSVG 306 also receives a supply voltage, such as Vdd 302, which is connected to a source of a PFET in TSVG 306. For example, Vdd 302 may be connected to implant area 110A in the two PFET embodiment of FIG. 2C, or Vdd 302 may be connected to implant areas 210A and 210D in the four PFET embodiment of FIG. 2D (see also schematic in FIG. 2E). The signal from switch control 301 is brought to chip 100 using a connector 332 as shown, and brought to TSV conductor 160 (or 260) using a conductor (metal, doped polysilicon, for examples) on a bottom surface of chip 100.

Drains of PFETs in TSVG 306 are connected at a distal end of TSVG 306, that is on a top surface of chip 100 to chip 310 using connectors 331. For example, implant area 110B in FIG. 2C would be connected to a connector 331. Implant areas 210B and 210C in FIG. 2D would be wired to a connector 331.

As shown in FIG. 3, a TSVG 306 on chip 100 receives Vdd 302 from chip 311 on a connector 332 and the TSVG 306 is connected to a Vdd 303 on chip 310 on a connector 331. Depending on a logic signal from switch control 301, Vdd 303 receives Vdd 302 (with some voltage drop across the switch PFET in the TSVG 306) or Vdd 303 "floats", that is, is disconnected from Vdd 302. Signals 304 and grounds Gnd 305 are un-switchably connected from chip 311 through chip 100 to chip 310.

As shown in FIG. 3, chip 310 comprises a voltage domain 309 and a voltage domain 308 which may be independently controlled by switch controls 301 that cause the respective TSVG 306 to conduct or to not conduct. A particular chip 310 may have a single voltage domain or may have additional voltage domains. Voltage domains may be connected to different voltage supplies. For example, voltage domain 308 may have a voltage of 1.0 volt and voltage domain 309 may have a voltage of 1.2 volts.

Figure 6:
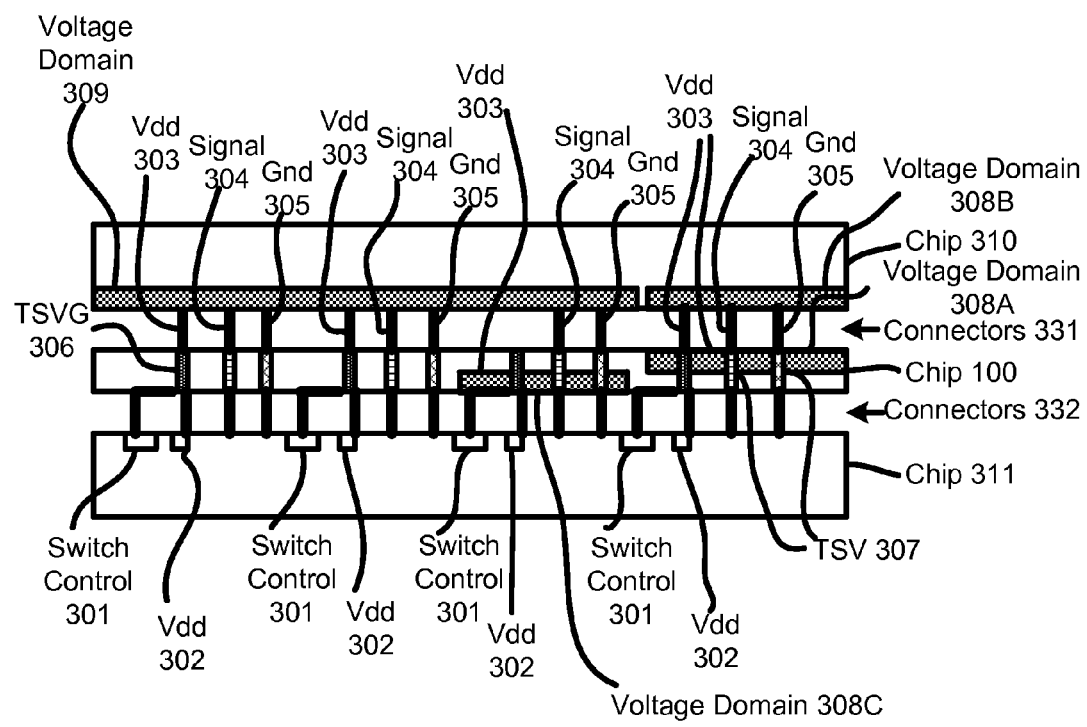
FIG. 6 shows a semiconductor chip constructed in FIGS. 2A-2D wherein one or more controlled voltage domains may be on the first semiconductor chip.

FIG. 6 shows a variant of the apparatus shown in FIG. 3. In FIG. 6, one or more voltage domains on a top surface (voltage domain 308A) or on a bottom surface (voltage domain 308C) of chip 100 may be controlled. As shown, the same controlled power domain 308A voltage supply also supplies chip 310 voltage domain 308B with Vdd 303. A controlled voltage supplied to voltage domain 308C is not also brought up to chip 310 as no connector 331 is shown. It will be understood that chip 100 may have one or more controlled voltage domains on the top surface of chip 100 or on the bottom surface of chip 100. Voltage domain 308C is contacted to the drain of the FET on the bottom surface of chip 100. It will be further understood that chip 310 may not be stacked on chip 100, with controlled voltage domains being entirely on chip 100 (such as voltage domain 308A or 308C).

Figure 4:
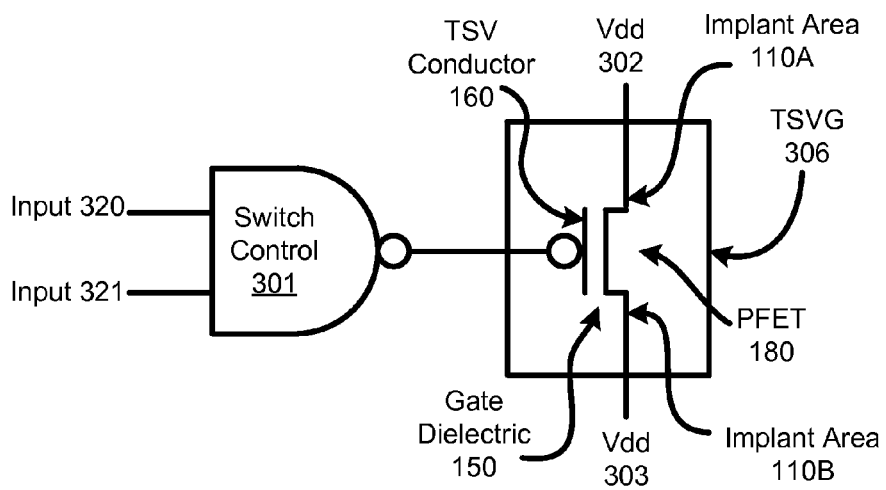
FIG. 4 shows a schematic of a switch control.

FIG. 4 shows an exemplary switch control 301, comprising a simple NAND gate which receives a first input 320 and a second input 321. Switch control 301 drives TSV conductor 160 (or 260) which controls PFET 180 (or 280) to connect or to disconnect Vdd 302 to Vdd 303. It will be understood that whereas a NAND is shown for exemplary purposes, any logical function suitable to control switching of PFET 180 (280) is contemplated.

What is claimed is:

1. A method for making a gated through silicon via (TSVG) in a semiconductor chip comprising:
    implanting a first implant area and a second implant area, the implanting extending from a top surface of the semiconductor chip to a bottom surface of the semiconductor chip;
    creating a through silicon via hole (TSV hole) through the semiconductor chip, the TSV hole cutting through a portion of the first implant area and the second implant area;
    creating a gate dielectric on an outer surface of the TSV hole while leaving a remaining portion of the TSV hole;
    filling the remaining portion of the TSV hole with a TSV conductor.

2. The method for making the gated through TSVG in the semiconductor chip, wherein the implanting of the first implant area and the second implant area further comprises:
    implanting a first implant dose in the first implant area and the second implant area using a first implant energy; and
    implanting a second implant dose in the first implant area and in the second implant area using a second implant energy.

* * * * *